United States Patent [19]

Aftergut et al.

[11] Patent Number: 5,641,984
[45] Date of Patent: Jun. 24, 1997

[54] HERMETICALLY SEALED RADIATION IMAGER

[75] Inventors: Siegfried Aftergut, Schenectady, N.Y.; John Frederick Ackerman, Cheyenne, Wyo.

[73] Assignee: General Electric Company, Schenectady, N.Y.

[21] Appl. No.: 292,920

[22] Filed: Aug. 19, 1994

[51] Int. Cl.⁶ ............................................... H01L 31/0232
[52] U.S. Cl. ........................................... 257/433; 257/432
[58] Field of Search ..................................... 257/433, 432, 257/434, 435; 250/370.11, 307, 368, 361 R, 366

[56] References Cited

U.S. PATENT DOCUMENTS

| | | | |
|---|---|---|---|
| 4,058,430 | 11/1977 | Suntola et al. | 156/611 |
| 5,132,539 | 7/1992 | Kwasnick et al. | 250/361 R |
| 5,179,284 | 1/1993 | Kingsley et al. | 250/370.11 |
| 5,187,369 | 2/1993 | Kingsley et al. | 250/370.11 |
| 5,401,668 | 3/1995 | Kwasnick et al. | 250/370.11 |
| 5,463,225 | 10/1995 | Kwasnick et al. | 250/370.11 |

Primary Examiner—Mahshid D. Saadat
Assistant Examiner—S. V. Clark
Attorney, Agent, or Firm—Donald S. Ingraham

[57] ABSTRACT

A hermetically packaged radiation imager includes a moisture barrier cover disposed over the imaging array and a hermetic seal structure disposed around the periphery of the moisture barder cover to seal the cover to the underlying substrate. The hermetic seal structure comprises a solder seal disposed in contact with the moisture barrier cover and a dielectric material layer disposed between the solder seal and conductive lines extending from the imager array across the substrate surface. The hermetic seal structure further includes a primer layer that is disposed between the dielectric material layer and the solder seal to provide a foundation to which the solder seal adheres. The dielectric material layer is deposited in an atomic layer epitaxy technique, thus providing a thin layer having high structural integrity.

11 Claims, 1 Drawing Sheet

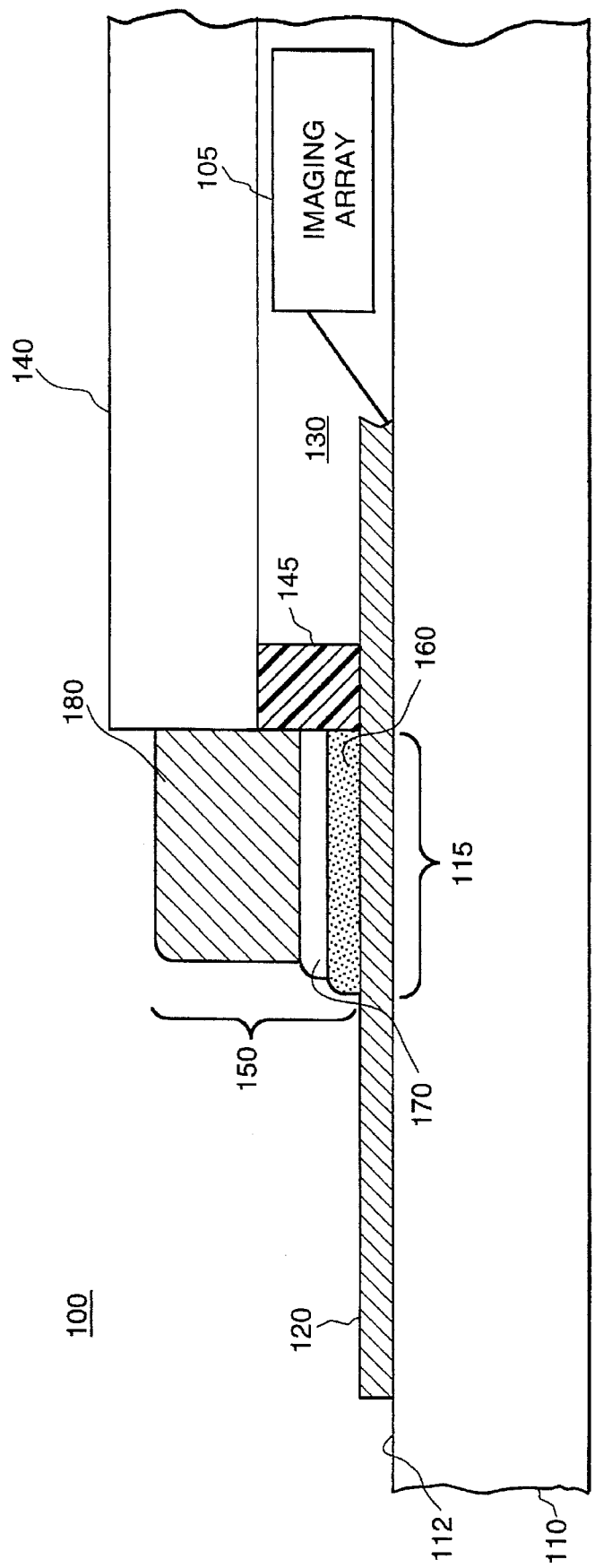

HERMETICALLY SEALED RADIATION IMAGER

BACKGROUND OF THE INVENTION

This invention relates generally to radiation imagers and in particular to solid state imaging array that are hermetically-sealed from the ambient environment.

Solid state radiation imaging systems are widely used for medical and industrial purposes. Commonly in such systems the radiation desired to be detected is absorbed in a scintillator material and the light photons generated by that absorption are then detected by an imaging array, such as a photodiode array. Both the scintillator material and the silicon-based semiconductive devices (such as photodiodes and thin film transistors (TFTs) used for addressing the photodiodes) in the imaging array are subject to degradation due to exposure to moisture, such as humidity in the ambient air. For example, cesium iodide, a common scintillator material, is hygroscopic, that is, it absorbs moisture from the atmosphere, which results in degradation of its luminescent properties; photodiodes and TFTs exposed to moisture suffer increased electrical leakage in various states of operation, which in turn results in higher noise in the array.

Imaging arrays are typically disposed on a glass substrate and have conductive lines extending to the edge of the substrate to allow connection to external electronic circuits. Currently the imaging array is packaged by placing a moisture barrier cover, such as an aluminum plate, over the array, and coupling the aluminum plate to the glass substrate with an epoxy seal that runs along the perimeter of the plate. Although the epoxy material provides good structural strength, it is an insufficient barrier to the passage of moisture into the imaging array package, especially in environments having high ambient humidity.

It is thus an object of this invention to provide a radiation imager that is effectively hermetically sealed from the ambient environment.

SUMMARY OF THE INVENTION

A hermetically packaged radiation imager in accordance with this invention includes a substrate having an imager array disposed thereon, with conductive lines extending across an array boundary portion of the surface of the substrate, a moisture barrier cover disposed over the imaging array, and a hermetic seal structure disposed on the boundary portion of the substrate surface so as to hermetically couple the moisture barrier cover to the substrate. The hermetic seal structure comprises a solder seal disposed in contact with the moisture barrier cover and a dielectric material layer disposed between the solder seal and the conductive lines extending across boundary portion of the substrate surface.

The dielectric material layer typically comprises a high integrity inorganic dielectric material such as titanium oxide or silicon nitride. The dielectric material layer is relatively thin, with a thickness less than 2 μm and typically between about 0.1 microns and 0.2 microns, and is deposited to have a substantially uniform thickness over the conductive lines and has high structural integrity, that is, it is substantially pin-hole free.

The hermetic seal structure typically further includes a primer layer that is disposed between the dielectric material layer and the solder seal. The primer layer typically comprises a metallic material having a thickness in the range between 0.01 μm and 0.5 μm and that is disposed to provide a foundation to which the solder seal adheres.

The dielectric material layer is deposited in an atomic layer epitaxy technique, thus providing a thin layer having high structural integrity. The solder material that comprises the solder seal is applied in a liquid state so as to flow and wet the surface of the moisture barrier cover and the primer layer, thus providing an effective (that is, high integrity) hermetic seal.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description in conjunction with the accompanying FIGURE which is a partial schematic and partial block diagram of a hermetically sealed radiation imager in accordance with this invention.

DETAILED DESCRIPTION OF THE INVENTION

A radiation imager 100 comprises an imaging array 105 disposed on a substrate 110. Substrate 110 typically comprises glass or similar non-conductive material that provides the necessary structural strength for the array. Imaging array 105 typically comprises a photosensor array coupled to a scintillator; the photosensor array commonly comprises photodiodes and associated address lines and switching devices to enable each photodiode in the array to be coupled to readout electronics (not shown). A plurality of conductive lines 120 (a representative one of which is illustrated in the FIGURE) extend from imaging array 105 across a surface 112 of substrate 110 towards the edge of substrate 110 at which contact to external readout circuits can be made.

Imaging array 105 is enclosed within a hermetically sealed chamber 130 that is bounded by substrate surface 112, a moisture barrier cover 140, and a hermetic seal structure 150. Moisture barrier cover 140 typically comprises a material that prevents the passage of moisture therethrough and that presents a low absorption cross section for the type of radiation which imager 100 is designed to detect. For example, for an x-ray imager, moisture barrier cover 140 is a plate that typically comprises aluminum and has a thickness in the range between about 5 mils (0.005 in) and 50 mils (0.05 in). Moisture barrier 140 is disposed over imaging array 105 and commonly is held in place by a bonding layer 145 that is disposed between barrier cover 140 and substrate 110; bonding layer 145 typically comprises epoxy or the like having a thickness (between moisture barrier cover 140 and substrate 110) in the range between about 10 mils (0.01 in) and 100 mils (0.1 in).

In accordance with this invention, hermetic seal structure 150 comprises a dielectric material layer 160, a primer layer 170, and a solder seal 180. Dielectric material layer 160 is disposed over substrate surface and conductive lines 120 in a boundary portion 115 of the substrate surface, that is the area of the surface at which the seal is made between substrate 110 and moisture barrier cover 140 to form hermetically sealed chamber 130 that contains imaging array 105. Dielectric material layer is formed in the fabrication process after completion of imaging array 105 and after bonding layer 145 is deposited and moisture barrier cover 140 is positioned over imaging array 105 and in contact with bonding layer 145. Inorganic material layer 160 is formed in an atomic layer epitaxy technique (also called atomic layer growth techniques), a technique that provides precise control of film thicknesses, a high degree of thickness uniformity, low deposition temperature (less than about 200° C.), and coverage of areas that are not in the line-of-sight of the evaporation sources.

In atomic layer epitaxy techniques, a single atomic or molecular layer of a precursor material is deposited at a time, and thus a single layer of a material or compound can be formed on a surface, including non-planar surfaces (such as substrate surface 112 with conducting lines 120 thereon), while maintaining precise thickness control. In accordance with this invention, dielectric material layer 160 typically comprises an inorganic dielectric such as silicon oxide, titanium oxide, silicon nitride, or the like. In synthesizing a compound film, the surface to be coated is placed in an evacuated chamber connected to a supply of starting material for the film to be formed. The growth technique consists of alternatively injecting a precursor of each component of the film (either an element or a compound) under conditions that promote the deposition of a monolayer of the desired compound. For example, the precursor materials for forming a layer of titanium oxide consist of titanium tetrachloride and water vapor, which are alternately injected into the chamber containing imager 100, which is masked so that the deposition occurs only along boundary portion 115 of substrate 110. Excess raw material beyond that of a monolayer is removed after each delivery by evacuation of the chamber or sweeping with an inert gas such as nitrogen.

Through the use of atomic layer epitaxy techniques, dielectric layer 160 is fabricated such that it has a relatively thin thickness, that is a thickness less than about 2 µm, and that is typically in the range between 0.1 µm and 0.2 µm. The thickness of dielectric layer 160 is substantially uniform (that is, the thickness of the layer does not vary more than about 5% from its nominal thickness, and in particular the thickness of the dielectric layer is substantially uniform over conductive lines 120). Further, the atomic layer epitaxy techniques result in the deposition of a high integrity inorganic dielectric layer, that is, a layer that is structurally robust and substantially free of pinholes such that it provides an effective electric insulator between solder seal 180 and underlying conductive lines 120. For example, in a solid state x-ray imager in accordance with this invention, dielectric layer 160 has a specific resistivity not less than about $10^6 \Omega$-cm. Dielectric layer 160 is shaped to be disposed between solder seal 180 and conductive lines 120 and thus provide electrical insulation. As shown in the FIGURE, dielectric layer 160 typically extends across horizontal part of boundary region 115 of substrate 110; even though, as shown, dielectric layer 160 does not extend over epoxy material of bonding layer 145, a hermetic seal is provided between epoxy material and solder seal 180; alternatively, dielectric layer 160 is disposed so that it further extends up the sidewall of bonding layer 145 to moisture barrier cover 140.

Next in the fabrication of hermetic seal structure 150, primer layer 170 is deposited so that it conforms to the shape of dielectric material layer 160 so as to provide a foundation to which the solder seal 180 can adhere (that is, primer layer is disposed between solder seal 180 and dielectric layer 160 in the finished device). Primer layer 170 thus comprises an adhesion promoter, such as a metallic material comprising two metals, for example titanium and gold. Primer layer 170 is deposited in an RF sputter, or alternatively, an evaporative process to a thickness in the range between about 500 Å and 5000 Å.

Solder seal 180 is disposed over primer layer 170 and extends around the periphery of moisture barrier cover 140 so as to provide a seal that is impervious to moisture in the ambient air surrounding imager 100. Solder seal 180 is formed from solder material that has a low melting point (less than about 200° C.), that is a solid at the anticipated operating temperature ranges of imager 100, and that forms a moisture impervious bond with moisture barrier cover 140 and primer layer 170. By way of example and not limitation, effective solder materials for solid state imager 100 as described above include tin, lead, indium, silver, bismuth, cadmium, or alloys or combinations of such materials. The solder material used is heated an deposited on imager 100 in a liquid state (typically one that is quite viscous to provide control of the spread of the solder material) so that the solder material wets the surface of moisture barrier cover 140 and the underlying primer layer 170. The solder material thus is deposited so that it conforms and bonds to the underlying surfaces and thus reduces gaps, voids, or interstices in coverage when the solder material hardens, thereby providing an effective moisture seal. For example, indium solder melts at about 100° C. and can be applied to flow around the boundary region 115 so that it is in contact with both moisture barrier cover 140 and primer layer 170; when cooled, the indium solder material hardens into solder seal 180. Dielectric layer 160 is disposed between solder seal 180 and conductive lines 120 such that no electrical shorting occurs between solder seal 180 and the conductive lines. The solder material is typically deposited so that solder material does not spill over onto the top of cover 140.

In operation, imager 100 can be placed in a variety of operating environments (such as might occur with a portable imager used for medical or industrial applications), including environments with high humidity, and not suffer degradation in performance due to high ambient moisture. Hermetic seal structure 150 provides an effective moisture-impervious seal between the substrate and the moisture barrier cover without otherwise affecting the operation of the imager.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A hermetically packaged radiation imager comprising:
   a substrate;
   a plurality of conductive lines extending across an array boundary portion of the surface of said substrate, said conductive lines being coupled to an imaging array disposed on said substrate;
   a moisture barrier cover disposed over said imaging array; and
   a hermetic seal structure disposed on said boundary portion of said substrate surface so as to hermetically couple said moisture barrier cover to said substrate, said hermetic seal structure comprising a solder seal disposed in contact with said moisture barrier cover and a dielectric material layer disposed between said solder seal and said plurality of conductive lines.

2. The imager of claim 1 wherein the thickness of said dielectric material layer is less than about 2 microns.

3. The imager of claim 2 wherein the thickness of said dielectric material layer is in the range between about 0.1 microns and 0.2 microns.

4. The imager of claim 1 wherein said dielectric material layer comprises a high integrity inorganic dielectric material disposed to a uniform depth over said plurality of conductive lines and said substrate surface.

5. The imager of claim 4 wherein said inorganic dielectric material is selected from the group consisting of silicon oxide, titanium dioxide and silicon nitride.

6. The imager of claim 1 wherein said solder seal comprises a material selected from the group consisting of indium, lead, tin, bismuth, silver, and cadmium.

7. The imager of claim 1 wherein said hermetic seal structure further comprises a primer layer disposed between said dielectric material layer and said solder seal.

8. The imager of claim 7 wherein said primer layer is disposed over said dielectric material layer so as to conform to the shape of said dielectric material layer and provide a foundation to which said solder seal adheres.

9. The imager of claim 8 wherein the thickness of said primer layer is in the range between about 500 Å and 5000 Å.

10. The imager of claim 8 wherein said primer layer comprises a metallic material.

11. The imager of claim 1 wherein said imager further comprises a bonding layer disposed between said moisture barrier cover and said substrate, said bonding layer being disposed in the interior of a hermetically-sealed chamber formed by said hermetic seal structure and said moisture barrier cover coupled to said substrate.

* * * * *